United States Patent
Ikeno et al.

(10) Patent No.: US 10,923,354 B2
(45) Date of Patent: Feb. 16, 2021

(54) ETCHING METHOD

(71) Applicants: Shin-Etsu Polymer Co., Ltd., Tokyo (JP); National University Corporation Saitama University, Saitama (JP)

(72) Inventors: Junichi Ikeno, Saitama (JP); Yohei Yamada, Saitama (JP); Hideki Suzuki, Saitama (JP)

(73) Assignee: NATIONAL UNIVERSITY CORPORATION SAITAMA UNIVERSITY, Saitama (JP)

( * ) Notice: Subject to any disclaimer, the term of this patent is extended or adjusted under 35 U.S.C. 154(b) by 0 days.

(21) Appl. No.: 16/485,937

(22) PCT Filed: Oct. 26, 2017

(86) PCT No.: PCT/JP2017/038670
§ 371 (c)(1),
(2) Date: Aug. 14, 2019

(87) PCT Pub. No.: WO2018/150637
PCT Pub. Date: Aug. 23, 2018

(65) Prior Publication Data
US 2020/0020535 A1    Jan. 16, 2020

(30) Foreign Application Priority Data
Feb. 16, 2017  (JP) .................................. 2017-027118

(51) Int. Cl.
*H01L 21/04* (2006.01)
*H01L 21/02* (2006.01)
(Continued)

(52) U.S. Cl.
CPC .... *H01L 21/0445* (2013.01); *H01L 21/02675* (2013.01); *H01L 21/302* (2013.01); *H01L 21/67248* (2013.01)

(58) Field of Classification Search
CPC ........... H01L 21/0445; H01L 21/02675; H01L 21/302; H01L 21/67248; H01L 21/30608;
(Continued)

(56) References Cited

U.S. PATENT DOCUMENTS

| | | | |
|---|---|---|---|
| 2014/0203300 A1* | 7/2014 | Hatayama | H01L 21/0475 257/77 |
| 2016/0020156 A1* | 1/2016 | Yamada | H01L 21/02008 438/14 |
| 2018/0040701 A1* | 2/2018 | Uchida | H01L 29/0696 |

FOREIGN PATENT DOCUMENTS

| | | |
|---|---|---|
| CN | 102569055 A | 7/2012 |
| JP | 2011-151317 A | 8/2011 |

(Continued)

OTHER PUBLICATIONS

Translation of CN102569055A (Year: 2012).*
(Continued)

*Primary Examiner* — Duy Vu N Deo
(74) *Attorney, Agent, or Firm* — Nath, Goldberg & Meyer; Jerald L. Meyer (57) ABSTRACT

An etching method in which: molten sodium hydroxide in a prescribed temperature range is used as a molten alkali, whereby an Si surface of an etching surface of an SiC substrate, in which the substrate surface is configured from the Si surface and a C surface, is removed at a higher speed than is the C surface while an oxide film is formed on the etching surface in a high-temperature environment containing oxygen.

6 Claims, 10 Drawing Sheets

(51) Int. Cl.
  *H01L 21/302* (2006.01)
  *H01L 21/67* (2006.01)
(58) Field of Classification Search
  CPC ......... H01L 21/67115; H01L 21/68764; H01L 21/67086; B23K 26/53
  See application file for complete search history.

(56) References Cited

FOREIGN PATENT DOCUMENTS

| | | |
|---|---|---|
| JP | 2014-22677 A | 2/2014 |
| JP | 2017-41526 A | 2/2017 |
| KR | 1020110076448 A | 7/2011 |

OTHER PUBLICATIONS

Katsuno, Masakazu, et al. "Mechanism of Molten KOH Etching of SiC Single Crystals: Comparative Study with Thermat Oxidation"; Jpn. J. Appl. Phys.; vol. 38 (1999), pp. 4661-1665.
Notification of Reason for Refusal dated Sep. 15, 2020 corresponding to Korean application No. 1020197024181.

\* cited by examiner

ETCHING METHOD

This is a National Phase Application filed under 35 U.S.C. 371 as a national stage of PCT/JP2017/038670, filed Oct. 26, 2017, an application claiming the benefit of Japanese Application No. 2017-027118, filed Feb. 16, 2017, the content of each of which is hereby incorporated by reference in its entirety.

TECHNICAL FIELD

The present embodiment relates to an etching method for etching a SiC substrate by molten alkali.

BACKGROUND ART

In manufacture of a semiconductor, or the like, defect detection by etching for a substrate of silicon carbide (SiC) or the like is widely performed. Then, the SiC substrate is expected as a next-generation power semiconductor substrate due to excellent characteristics thereof.

CITATION LIST

Patent Literature

PTL 1: JP 2014-22677 A

SUMMARY

Technical Problem

Incidentally, there is a problem that it takes a long time and much cost to form a SiC substrate with a good surface that is less damaged since the number of processing steps required therefor is large. Moreover, since precise polishing is required to obtain a defect-free state, the number of required processing steps is increased, and this is also a cause why it takes a long time and much cost.

In particular, the SiC substrate has high hardness, and is a hard-to-process material chemically stable to chemicals with some exceptions, and is also a hard-to-grind materials. Accordingly, it takes a time to polish and grind the SiC substrate, and such problems as above become more noticeable.

In view of the above-described problems, it is an object of the present embodiment to provide an etching method capable of performing etching in a state where no etch pit is present, and as a result, capable of manufacturing a wafer having a defect-free surface state and a mirror surface.

Solution to Problem

In order to solve the above-described problems, the inventors of the present embodiment have repeatedly conducted study, and have turned their attention to a method for investigating a defect of a SiC wafer by molten alkali. This method is a method of investigating a defect in a vicinity of a surface of the SiC wafer, in which the SiC wafer is immersed into the molten alkali to thereby observe the defect as such an etch pit.

Then, the inventors of the present embodiment have studied by repeating experiments, and thereby have found that it is possible to obtain a wafer with a mirror surface free from etch pits by performing continuous etching for the SiC substrate while forming an oxide film thereon without immersing the SiC substrate into the molten alkali. Then, the inventors of the present embodiment have further repeated experiments to study more, and have accomplished the present embodiment.

An aspect of the present embodiment for solving the above-described problem is an etching method, under an environment of high temperature and containing oxygen and using molten sodium hydroxide as molten alkali brought into a prescribed high temperature range, including the steps of forming an oxide film on etching target surfaces a SiC substrate, the surfaces of the SiC substrates including a Si surface and a C surface; and removing the Si surface of etching target surfaces at a higher rate than for the C surface while performing the step of forming the oxide film. In such a way, there can be provided an etching method capable of performing etching in a state where no etch pit is present, and as a result, capable of manufacturing a wafer having a defect-free surface state and a mirror surface.

The oxide film may be removed by performing isotropic etching for the etching target surface.

An oxidation rate of the SiC substrate is set equal to or higher than a dissolution rate of the oxide film, whereby the isotropic etching may be performed for the etching target surface.

An environment where the molten sodium hydroxide is used in the atmosphere may be defined as the high-temperature environment containing oxygen.

An environment where the molten sodium hydroxide is used in a space where oxygen gas is supplied to the etching target surface may be defined as the high-temperature environment containing oxygen.

The oxide film may be removed by flowing the molten sodium hydroxide to the etching target surface of the SiC substrate.

In this case, when the molten sodium hydroxide is flown to the etching target surface, the SiC substrate may be inclined at a prescribed angle with respect to a horizontal plane while setting the etching target surface to an upper surface side, and the molten sodium hydroxide may be flown from an upper portion side of the etching target surface to a lower portion side of the etching target surface.

The prescribed high temperature range may be set to 650° C. or more.

In this case, the method may further include the steps of disposing a laser condenser on an irradiated surface of a SiC crystal member in a non-contact manner, the laser condenser being for condensing a laser beam; applying a laser beam to the irradiated surface to condense the laser beam into an inside of the SiC crystal member by the laser condenser, and moving the laser condenser and the SiC crystal member relatively to each other to form a two-dimensional modified layer in the inside of the SiC crystal member; forming a SiC crystal substrate by peeling off from the modified layer, a crystal layer formed by being divided by the modified layer, and obtaining the SiC crystal substrate by the peeling to use as the SiC substrate.

Effects

The present embodiment can provide an etching method capable of forming a good mirror surface over a wide range at a high rate.

BRIEF DESCRIPTION OF DRAWINGS

FIGS. 11(a) and 11(b) are graph views in Experiment example 2.

FIGS. 12(a) and 12(b) are graph views in Experiment example 2.

FIGS. 13(a) and 13(b) are graph views in Experiment example 2.

DESCRIPTION OF EMBODIMENTS

Hereinafter, a description will be given of the present embodiment with reference to the accompanying drawings. In the following description, the same or similar reference numerals are assigned to the same constituents as or similar constituents to those already described, and a detailed description thereof is omitted as appropriate.

FIGS. 1(a) to 1(c) are schematic front views explaining that a SiC substrate is sequentially and gradually etched by an etching method according to the present embodiment (hereinafter, referred to as "this embodiment"). FIG. 2 is a partially enlarged side view of FIG. 1(b).

An etching method according to this embodiment is an etching method of etching, by molten alkali, a SiC substrate in which substrate surfaces are composed of an Si surface and a C surface, wherein, by using, as the molten alkali, molten sodium hydroxide brought into a prescribed high temperature range, the Si surface as an etching target surface of the SiC substrate is removed at a higher rate than for the C surface while an oxide film is being formed on the etching target surface under a high-temperature environment containing oxygen.

Figure 1:
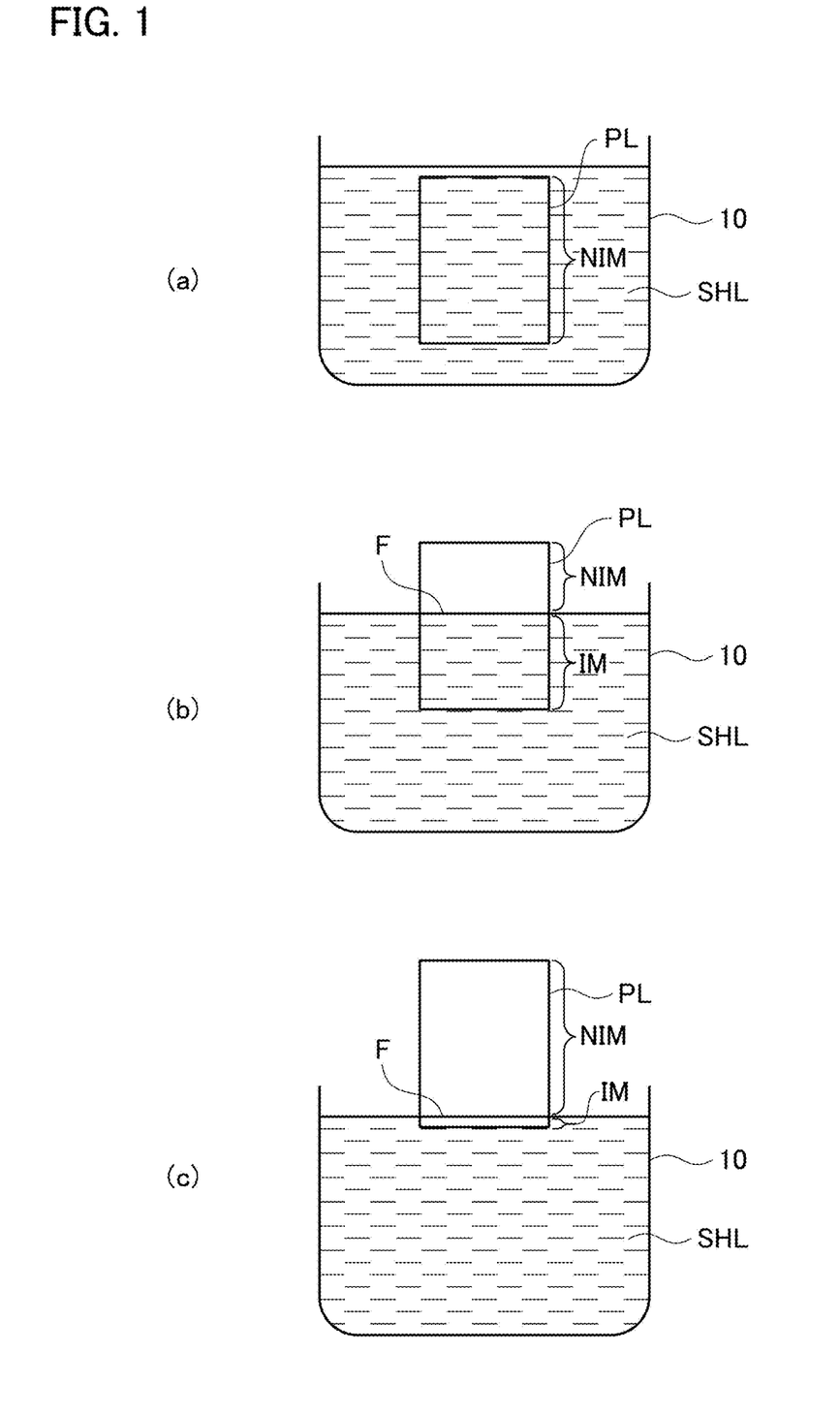
FIGS. 1(a) to 1(c) are schematic front views explaining that a SiC substrate is sequentially and gradually etched by an etching method according to the present embodiment.
Figure 2:
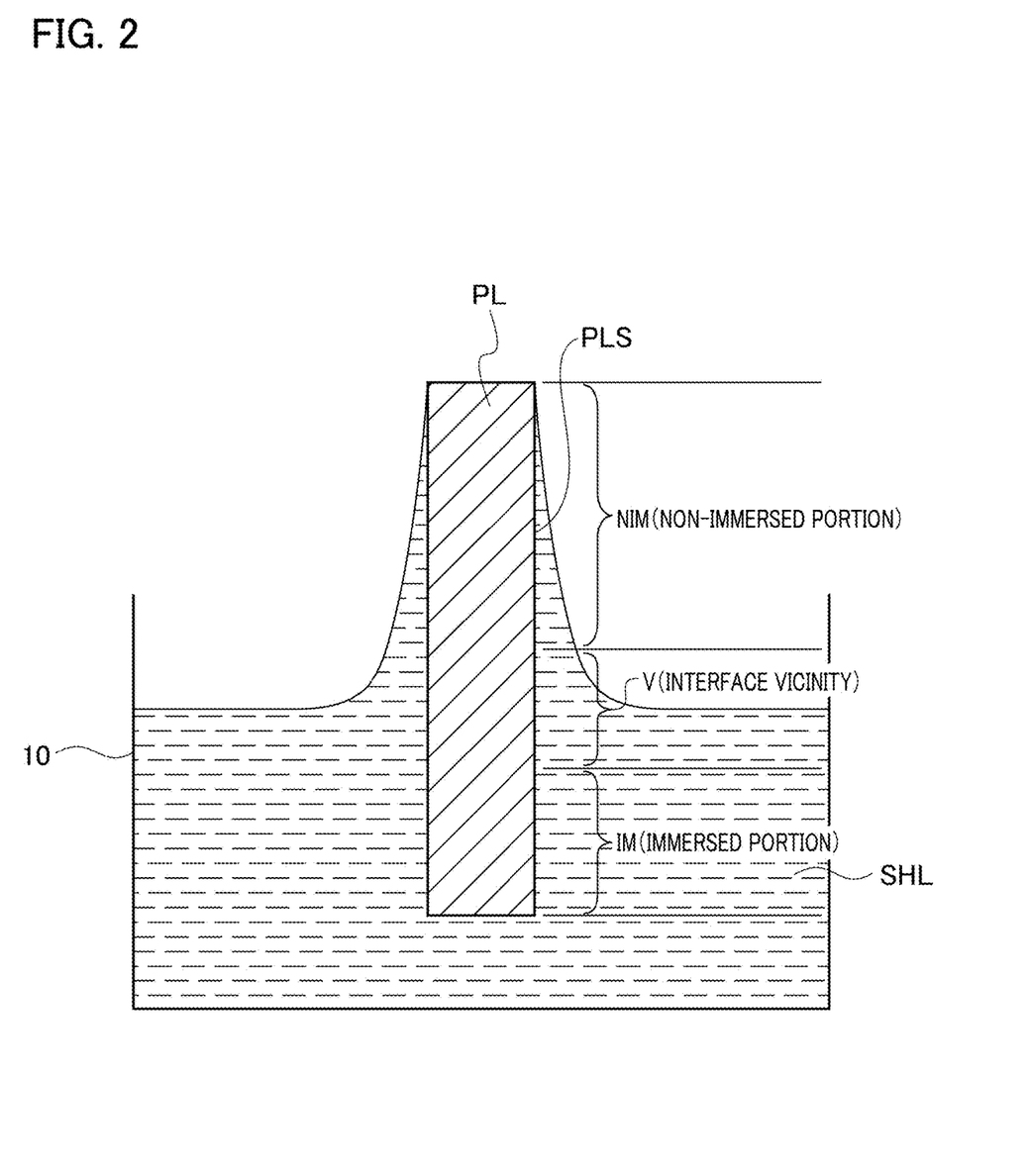
FIG. 2 is a partially enlarged side view of FIG. 1(b).

Specifically, in the atmosphere, a SiC substrate PL in which substrate surfaces are composed of an Si surface and a C surface is first put into molten sodium hydroxide SHL poured into a container 10 (see FIG. 1(a)). Then, the SiC substrate PL is gradually pulled up at a constant speed (see FIGS. 1(a) to 1(c)). Hence, an interface position F (liquid level position) of the molten sodium hydroxide SHL on a substrate surface PLS of the SiC substrate PL sequentially moves downward from an upper end of the substrate. Note that, as illustrated in FIG. 1 and FIG. 2, the interface position F of the molten sodium hydroxide SHL in this description is the same as a liquid level position of the molten sodium hydroxide SHL.

The molten sodium hydroxide SHL is disposed, whereby a temperature of the surrounding atmosphere rises. Hence, formed is an environment where the substrate surface PLS of the SiC substrate PL is easy to oxidize by oxygen in the atmosphere. Then, in an interface vicinity V of the SiC substrate PL and a non-immersed portion NIM (particularly the interface vicinity V) close to the interface, an oxidation reaction progresses efficiently by the oxygen in the atmosphere, and the oxide film is formed efficiently. Then, at the same time, the oxide film is removed by the molten sodium hydroxide SHL, whereby good etching is performed at a high rate. More specifically, in a boundary region of the liquid level, the molten alkali rises on a SiC surface by surface tension, and forms a thin film of a molten alkali liquid. Then, since this film is thin, it is easy to supply oxygen in air to the SiC surface, and oxidation thereof is activated. Then, such a cycle where the oxide film is formed and then removed by the molten alkali is repeated actively. Hence, mirror surface formation (isotropic etching) is promoted efficiently.

Moreover, in the interface vicinity V and the non-immersed portion NIM (particularly the interface vicinity V), the Si surface as the etching target surface of the SiC substrate PL can be removed by etching at a significantly higher rate than for the C surface. Note that, with regard to the Si surface and the C surface, a surface (a substrate surface terminated by Si atoms) in which the Si atoms are oriented in a direction of the surface when a single SiC bonding is cut is the Si surface, and a surface (a substrate surface terminated by C atoms) in which the C atoms are oriented in a direction of the surface when the single SiC bonding is cut is the C surface.

Moreover, particularly when the molten sodium hydroxide is used, the Si surface of the SiC substrate PL is easy to etch at a high rate. The Si surface is difficult to polish both mechanically and chemically, and accordingly, this is greatly effective when the Si surface is turned to a mirror surface at a high rate. Note that, when not the Si surface but the C surface is etched, it is preferable to use molten potassium hydroxide from a viewpoint of turning the C surface to a mirror surface by efficiently removing the same (acceleration of an etching rate).

In order to etch the Si surface at a high rate, it is preferable that the Si surface be etched at a higher temperature atmosphere. Specifically, a temperature in this case is preferably 650° C. or more, more preferably 800° C. or more, and a much higher temperature is allowed. In the etching method of the present embodiment, the oxide film is removed by etching while the oxide film is being formed on the Si surface. With regard to the oxide film to be formed, it is conceived that a good mirror surface free from a grinding mark and a defect is obtained by gradually and continuously removing a rapidly oxidized oxide film with a thickness of approximately 10 nm by etching and finally removing an oxide film with a thickness of 10 μm to several ten micrometers. In a process of this oxidization, the oxide film is also formed on a defective portion present in the inside of the wafer, whereby the isotropic etching is enabled.

In order that good etching is performed on the Si surface at a high rate, a pull-up speed (rising speed) of the SiC substrate PL is determined in consideration of relationships among the thickness of the oxide film, the oxide film forming rate and the etching rate and in response to a type of the molten sodium hydroxide SHL, a temperature, an oxygen concentration in the gas atmosphere, and the like.

Then, in this embodiment, an oxidation rate of the SiC substrate PL is set equal to or higher than a dissolution rate of the oxide film, whereby the isotropic etching is performed for the etching target surface. As described above, the oxidation rate of the SiC substrate PL is set equal to or higher than the dissolution rate of the oxide film, whereby etching of an unoxidized substrate material (SiC) is avoided. In other words, even if a defect (crystal defect) occurs in the substrate material, this defect is etched after the oxidation, that is, after the oxide film is formed. As a result, the SiC substrate PL is subjected to the isotropic etching. Accordingly, the defect of the surface etched by this isotropic etching is also removed, and anisotropic etching in which the defect of the substrate surface PLS is directly etched is avoided, and therefore, a good mirror surface can be formed at a high rate over a wide range of the substrate surface PLS. In other words, in comparison with etching performed by immersing the entire SiC substrate with the molten sodium hydroxide SHL (turning the whole of the substrate to an immersed portion), this good mirror surface can be formed on the whole of the substrate in a much shorter time.

Note that, even if the interface position F (the liquid level position of the molten sodium hydroxide SHL) of the molten sodium hydroxide SHL in the SiC substrate PL is sequentially moved upward of the substrate by gradually lowering the SiC substrate PL to the molten sodium hydroxide SHL from above at a constant speed, such a good mirror surface can be formed at a high rate over the wide range of the substrate surface PLS of the SiC substrate PL.

It is also conceived to use molten potassium hydroxide (KOH) in place of the molten sodium hydroxide; however, the molten sodium hydroxide SHL (see FIG. 1 and FIG. 2) is preferable from viewpoints of cost, availability and the like.

Figure 10:
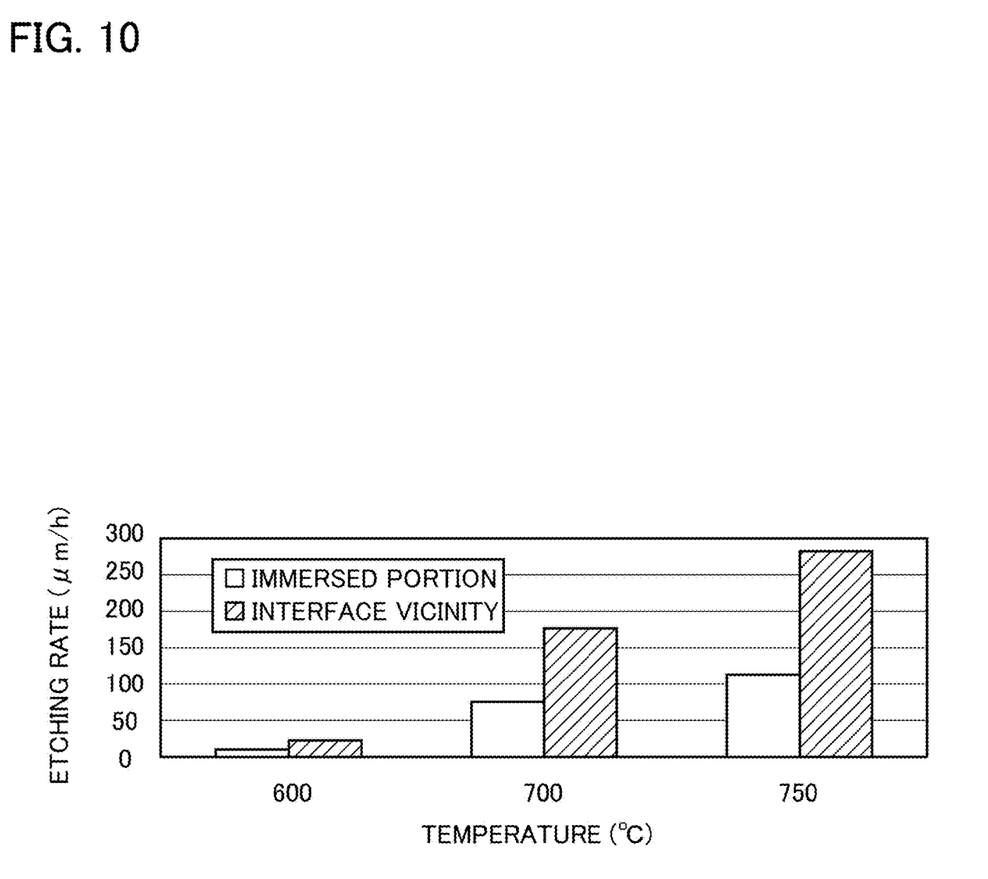
FIG. 10 is a graph view illustrating a relationship between an etching temperature and an etching rate in Experiment example 2.

In this case, when molten sodium hydroxide obtained by heating sodium hydroxide to 600° C. or more (more preferably to a range of 650 to 1100° C., or a temperature more than the same), it is easy to perform such good etching at a high rate. Note that, at 1000° C. or more, obtained is a higher etching rate than an etching rate at 750° C., which is illustrated in FIG. 10 to be described later.

Moreover, when the temperature of the molten sodium hydroxide SHL is increased, the etching rate rises greatly, and roughness of the interface vicinity V can be reduced in a short time (see also Experiment example 2, FIG. 10 and FIG. 11(b), which will be described later). Accordingly, the substrate surface PLS may be smoothed efficiently by sprinkling the molten sodium hydroxide SHL onto protrusions thereof.

Moreover, a temperature distribution is formed on the substrate surface PLS to increase an etching rate in a high-temperature portion of the substrate surface, thus also making it possible to adjust flatness of the substrate surface PLS. This temperature distribution can be performed, for example, by irradiation of a laser beam, or the like.

Moreover, when the substrate surface PLS as the etching target surface of the SiC substrate PL is oxidized and etched, it is also possible to remove an oxide film with a prescribed thickness (for example, a thickness of several nanometers to several ten nanometers) by the molten sodium hydroxide SHL, which is brought into a prescribed high temperature range, while forming this oxide film on the substrate surface PLS. In this case, it is preferable to set a thickness (an etching depth) of an oxide film finally removed by etching within a range of 10 to 80 μm. If the thickness is smaller than 10 μm, then there is an apprehension that an etching amount may be apt to be insufficient, and if the thickness is larger than 80 μm, then such a mirror surface is apt to be difficult to obtain.

Moreover, the SiC substrate PL may be one cut out from a SiC crystal member, or may be one peeled off from the SiC crystal member.

Figure 3:
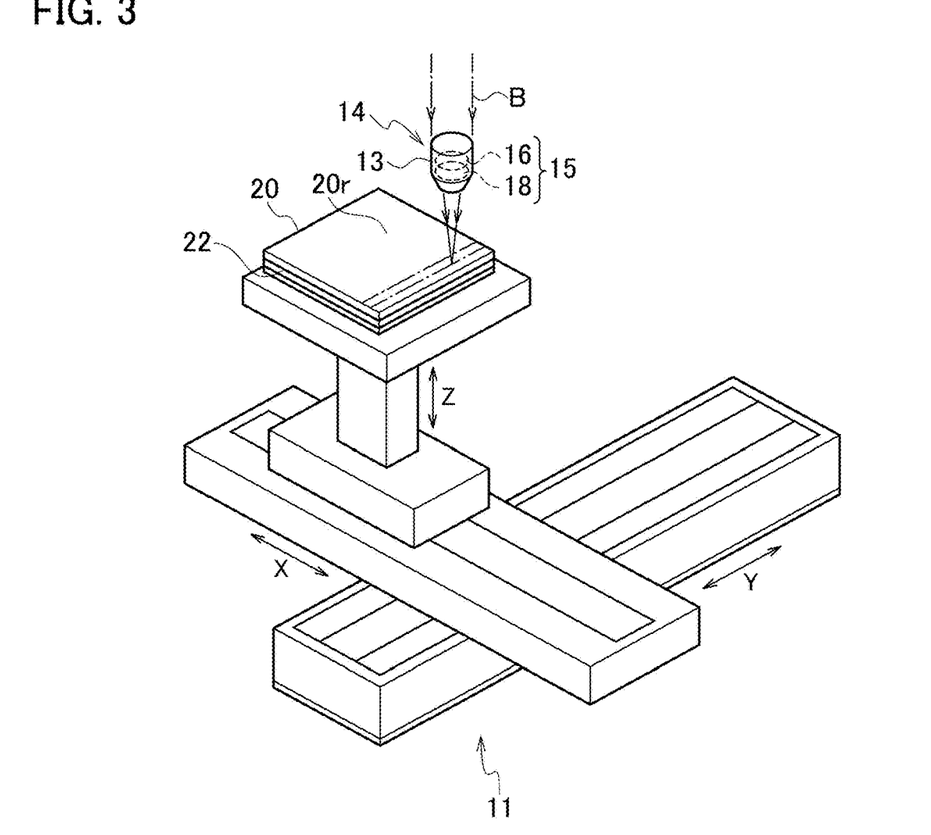
FIG. 3 is a perspective view illustrating an example of a substrate processing device for forming a SiC substrate to be used in the etching method according to the present embodiment.

The SiC substrate PL is obtained by being peeled off from the SiC crystal member, for example, in such a way as below. First, as illustrated in FIG. 3, a SiC crystal member 20 is mounted on an XY stage 11. Then, performed is a step of disposing laser condensing means 14 (a laser condenser) on an irradiated surface 20r of the SiC crystal member 20 in a non-contact manner, the laser condensing means being for condensing a laser beam B.

Then, performed is a step of causing the laser condensing means 14 to apply the laser beam B to the irradiated surface 20r of the SiC crystal member 20 (as an example, illustrated in a substrate state in FIG. 3) and to condense the laser beam B to a prescribed thickness position inside the SiC crystal member 20, moving the laser condensing means 14 and the SiC crystal member 20 relatively to each other, and forming a two-dimensional modified layer 22 inside the SiC crystal member 20.

Moreover, performed is a step of forming a SiC crystal substrate by peeling off a crystal layer, which is formed by being divided by the modified layer 22, from the modified layer 22. The SiC crystal substrate obtained by this peeling is used as the SiC substrate PL. In this way, a good mirror surface can be formed by etching at a high rate over a wide range of the peeled surface of the SiC crystal substrate with a prescribed thickness.

Then, even if surface roughness of this peeled surface (substrate surface) is large, the peeled surface may by smoothed efficiently by sprinkling the molten sodium hydroxide SHL to the protrusions of the peeled surface, and moreover, flatness of the peeled surface may be adjusted by forming a temperature distribution on the peeled surface and increasing the etching rate in the high-temperature portion of the substrate surface.

The SiC crystal member 20 for use may have a substrate shape as illustrated in FIG. 3, thus making it possible to obtain two SiC crystal substrates with a prescribed thickness by being peeled off from the modified layer 22.

Figure 4:
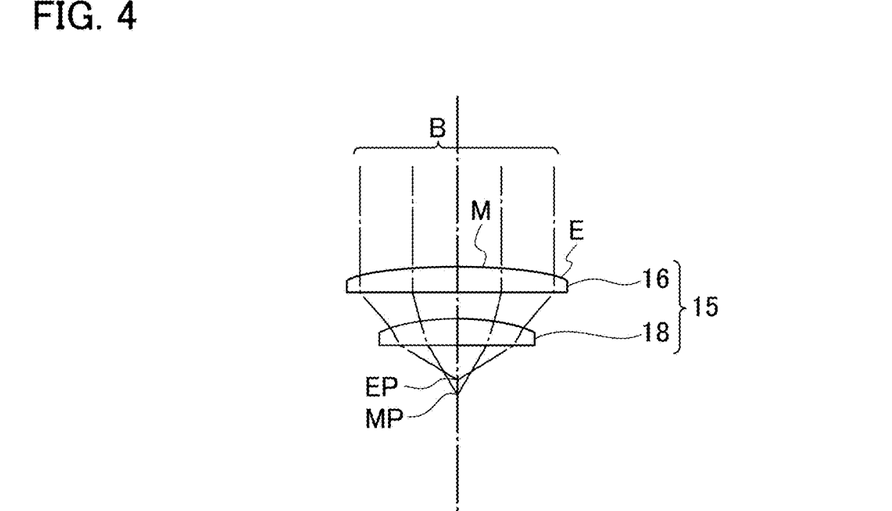
FIG. 4 is a side view explaining lenses in a correction ring of the substrate processing device illustrated in FIG. 3.

Moreover, the laser condensing means 14 includes: a correction ring 13; and a condenser lens 15 held in the correction ring 13, and may have a function to correct an aberration caused by a refractive index of the SiC crystal member 20, that is, a function as an aberration correction ring. Specifically, as illustrated in FIG. 4, when condensing the laser beam B in the air, the condenser lens 15 corrects the laser beam B so that such a laser beam B that has reached an outer peripheral portion E of the condenser lens 15 is condensed closer to the condenser lens 15 than such a laser beam B that has reached a center portion M of the condenser lens 15 is. That is, in the case of the beam condensation, the laser beam B is corrected so that a condensing point EP of the laser beam B that has reached the outer peripheral portion E of the condenser lens 15 is located at a position closer to the condenser lens 15 than a condensing point MP of the laser beam B that has reached the center portion M of the condenser lens 15 is. In this way, it is easy to reduce a length in a laser irradiation direction of a machining mark formed by the condensation of the laser beam, that is, it is easy to reduce a thickness of the modified layer 22.

In order to reduce the thickness of the modified layer 22 as described above, for example, this condenser lens 15 is composed of a first lens 16 that condenses the laser beams in the air, and a second lens 18 disposed between this first lens 16 and the SiC crystal member 20. Then, the laser condensing means 14 is configured to be capable of adjusting an interval between the condensing point EP and the condensing point MP by adjusting a rotational position of the correction ring 13, that is, adjusting an interval between the first lens 16 and the second lens 18. The laser condensing means 14 is configured to have a function as a correction ring-added lens by means of a simple configuration.

Modified Example

Figure 5:
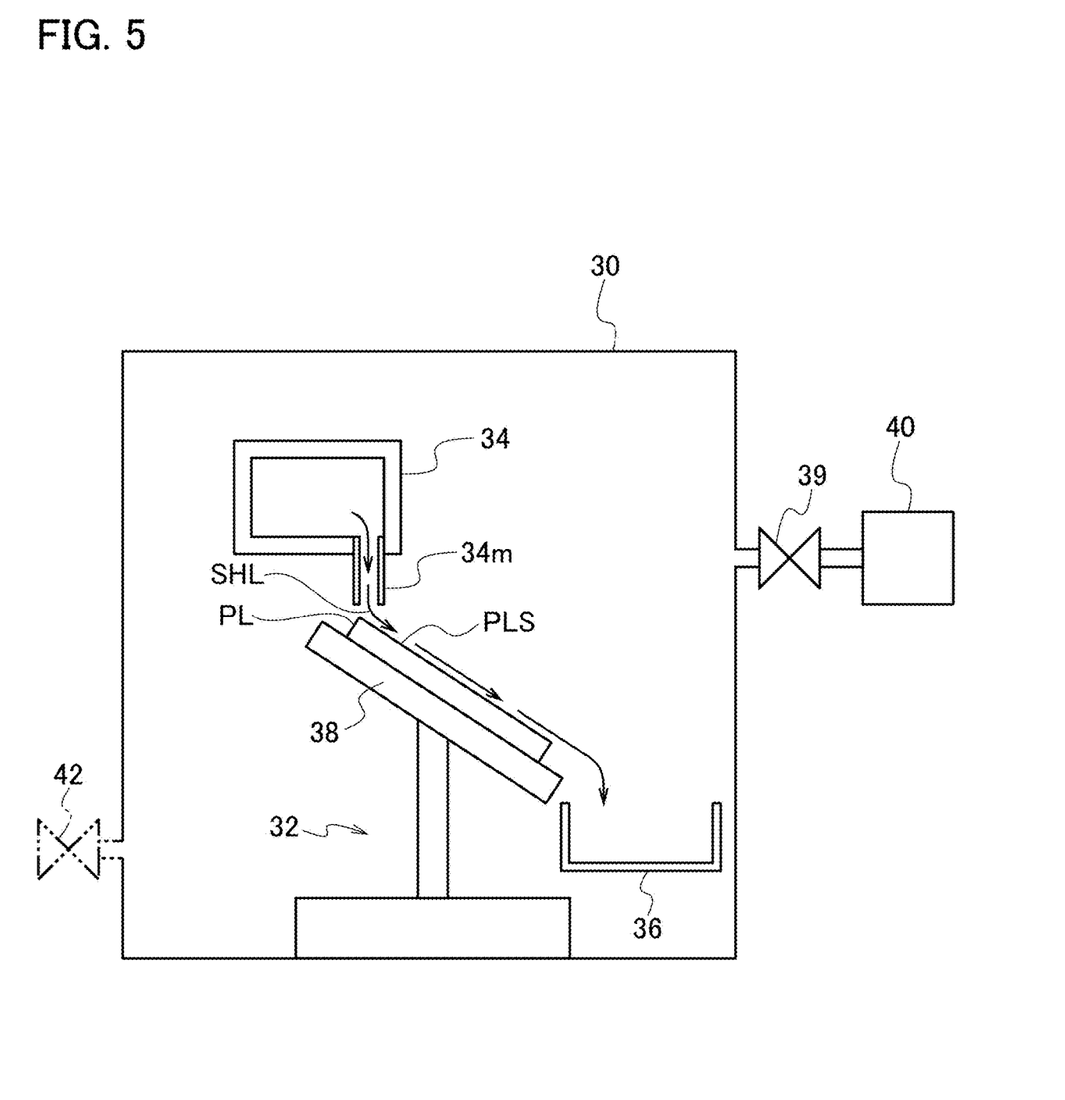
FIG. 5 is a schematic side view explaining that the SiC substrate is etched by an etching method according to a modified example of the present embodiment.

A description will be given below of an example of performing etching while flowing molten sodium hydroxide in a container. In this modified example, as illustrated in FIG. 5, there are disposed: an electric furnace 30; a substrate holding portion 32 that is installed in the electric furnace 30 and holds a substrate on an upper surface side thereof, a tank 34 capable of reserving molten sodium hydroxide and supplying the molten sodium hydroxide from a supply port 34m; and a housing portion 36 that allows inflow of the molten sodium hydroxide SHL, which has flown on the substrate surface PLS on the substrate holding portion 32, and houses the molten sodium hydroxide SHL.

The substrate holding portion 32 is provided with an inclined holding plate 38 that holds the substrate PL (SiC wafer) on an upper surface side thereof. This inclined holding plate 38 is inclined with respect to the horizontal plane so that an inclination angle thereof is variable and so as to flow the molten sodium hydroxide SHL, which is flown to an upper portion of the substrate PL, downward of the substrate PL, and is configured to be capable of moving horizontally (moving in a direction perpendicular to FIG. 5) with respect to the supply port 34m over the whole of the upper portion of the substrate PL. Note that the molten sodium hydroxide SHL may be sprayed from a nozzle to the upper portion of the substrate PL, and moreover, the inclined holding plate 38 may be configured to be rotatable about a rotation axis thereof.

Moreover, to the electric furnace 30, connected is an oxygen supply portion 40 (for example, an oxygen cylinder) via an on-off valve 39. Then, an on-off valve 42 is connected to the electric furnace 30, and gas in the electric furnace is made dischargeable.

In this modified example, the inclined holding plate 38 is inclined by a prescribed angle with respect to the horizontal plane, and the SiC substrate PL is held on this inclined holding plate 38 while exposing the upper surface side thereof as an etching target surface. Then, in the electric furnace 30 set to an oxygen atmosphere, the molten sodium hydroxide SHL is flown from the tank 34 to the upper portion side of the substrate surface (substrate upper surface) PLS as the etching target surface of the SiC substrate PL, and meanwhile, the inclined holding plate 38 is moved horizontally (moved in the direction perpendicular to FIG. 5) to flow the molten sodium hydroxide SHL to a lower portion side over the whole of the upper portion of the SiC substrate PL. A temperature in the electric furnace 30, a temperature and flow rate of the molten sodium hydroxide SHL, a moving speed of the SiC substrate PL, and the like are adjusted so that the oxidation rate of the SiC substrate PL becomes equal to or more than a dissolution rate of the oxide film, and so that the Si surface can be removed at a higher rate than for the C surface in such a way that the oxide film formed on the substrate surface PLS as the etching target surface of the SiC substrate PL is moved efficiently.

In this modified example, the molten sodium hydroxide is flown to the substrate surface PLS of the inclined SiC substrate PL downward from the upper portion as described above. Accordingly, a good mirror surface can be formed on the substrate surface PLS at a high rate highly efficiently over a wide range while subjecting the SiC substrate PL to the isotropic etching.

Note that, even if oxygen is not substituted for the entire region in the electric furnace unlike in this modified example, a similar effect to that in this modified example is obtained by covering at least the etching target surface (substrate surface) with oxygen.

Experiment Example 1—Confirmation of High-Rate Mirror Surface Formation Phenomenon by Wet Etching In this experiment example, approximately a half of a SiC wafer was immersed in molten sodium hydroxide (molten NaOH), whereby an immersed portion IM immersed in the molten NaOH and a non-immersed portion NIM that was not immersed in the molten NaOH were generated. In this state, the SiC wafer was etched. Note that the SiC wafer used in the following experiment example was one in which a surface was ground by a diamond wheel with a grain size of #1000 as pre-machining.

Experiment Condition and Experiment Method

The inventors of the present embodiment put approximately 5 g of solid NaOH into a nickel (Ni)-made crucible, heated the solid NaOH by an electric furnace to turn the same into a molten state at 750° C., immersed in approximately a half of a Si wafer (SiC substrate), which was fixed by a Ni wire, to the molten NaOH, and etched the SiC wafer for 20 minutes. The used wafer is a 4H—SiC wafer in which an off angle is 4° and a size is 10 mm square. As pre-machining, the SiC substrate was ground by a diamond wheel (SD #1000). An evaluation for an etching rate was obtained from a thickness difference between before and after the etching. For roughness measurement, a probe-type roughness measure (PGI840 made by Taylor Hobson) was used. Note that a main reason for the grinding is to remove swell or warp of the wafer.

Exterior Appearance and Shape of Etching Target Surface

Figure 6:
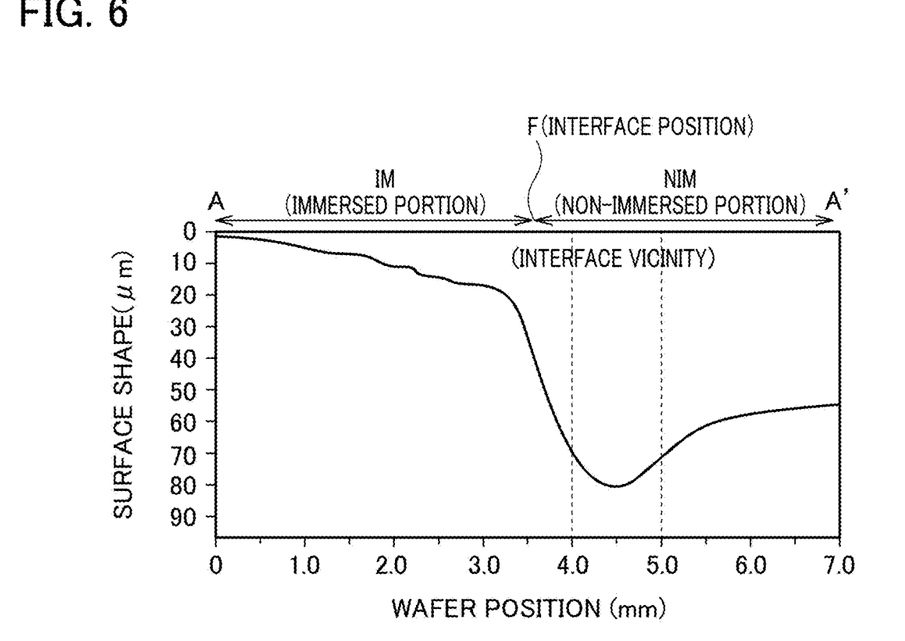
FIG. 6 is a graph view illustrating roughness of a substrate surface already etched in Experiment example 1.

FIG. 6 illustrates a shape of an already etched SiC wafer surface. In measurement for obtaining FIG. 6, a surface height along a straight line was measured on the substrate surface.

From FIG. 6, it is seen that the non-immersed portion NIM is removed more by etching than the immersed portion IM. Particularly, in a region apart by 1 mm from the interface position F, the non-immersed portion NIM was removed 60 μm more than the immersed portion IM.

Detail Observation of Etching Target Surface

Moreover, the immersed portion IM and the interface vicinity V of the non-immersed portion NIM were observed and photographed by laser microscope images. Individual photographing results are shown in FIG. 7 and FIG. 8.

Figure 7:
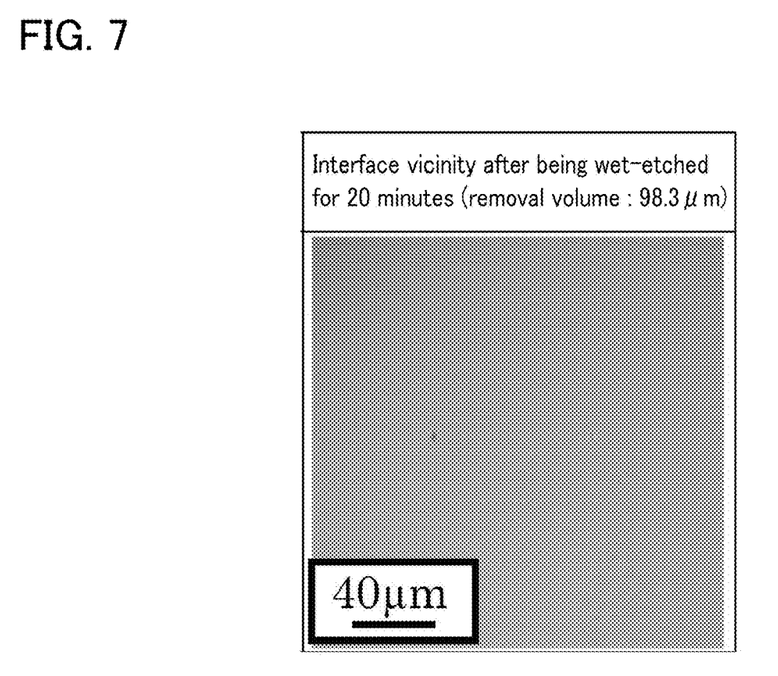
FIG. 7 is a photograph view illustrating a vicinity of an interface in a non-immersed portion of the substrate surface already etched in Experiment example 1.
Figure 8:
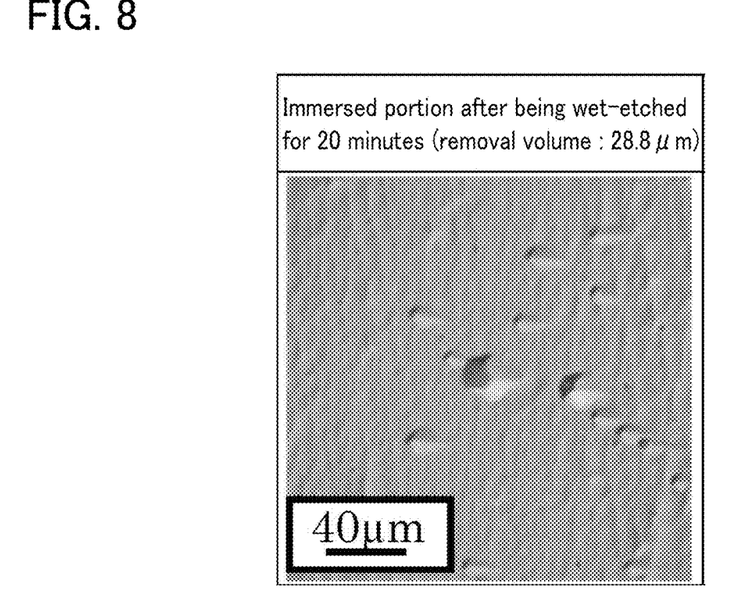
FIG. 8 is a photograph view illustrating an immersed portion of the substrate surface already etched in Experiment example 1.

In the immersed portion IM, an occurrence of etch pits was observed (see FIG. 8), and meanwhile, it was confirmed that the non-immersed portion NIM was a smooth surface free from etch pits (see FIG. 7).

Figure 9:
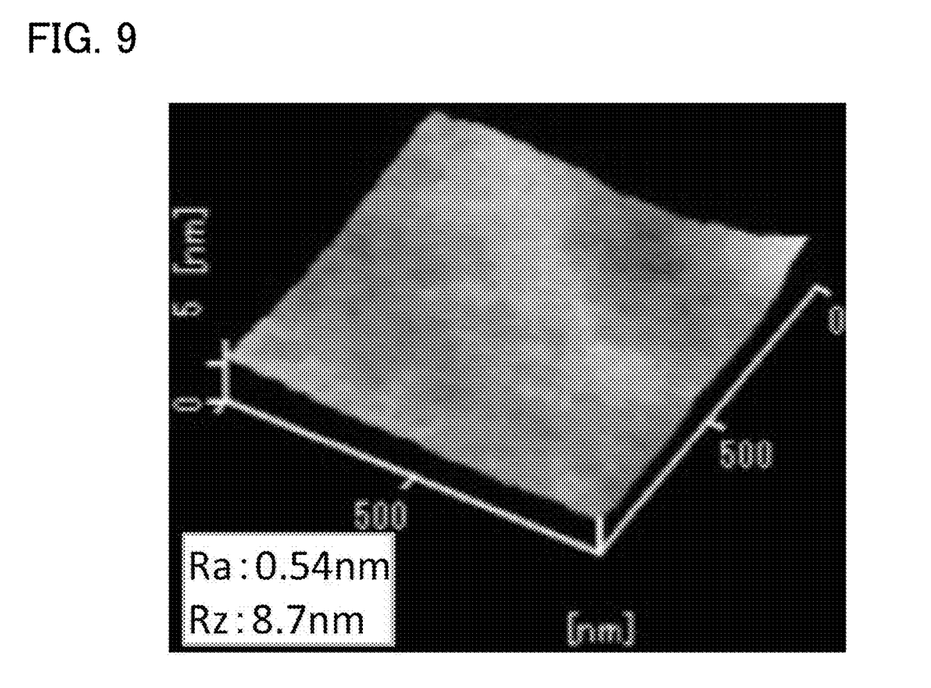
FIG. 9 is a perspective view obtained by photographing, by an AFM, the non-immersed portion already etched in Experiment example 1.

Moreover, FIG. 9 illustrates a result of measuring the non-immersed portion NIM in a unit of 1 μm×1 μm by an AFM. As a result of this measurement, it was confirmed that the non-immersed portion NIM was a mirror surface with roughness of 0.54 nmRa and 8.7 nmRz.

Experiment Example 2—Investigation of Basic Characteristics of Etching

In this experiment example, performed was an experiment of investigating how etching characteristics were affected by a temperature and a gas atmosphere.

Influence Given by Temperature to Reached Surface Roughness and Etching Rate

On the basis of the experiment method of Experiment example 1, an etching experiment was performed while changing an experiment time from 20 minutes to 120 minutes and changing a temperature from 600 to 750° C. In this experiment example, relationships between an etching temperature and an etching rate were investigated for the immersed portion IM and the interface vicinity V of the non-immersed portion NIM. Experiment results are shown in FIG. 10.

It was seen that, in each of the immersed portion IM and the interface vicinity V, the etching rate thereof tended to be increased more as the temperature was higher, and rates of the increase in both were approximately equal to each other. Then, the etching rate in the interface vicinity V became as high as approximately 2 to 3 times that in the immersed portion IM. Particularly at 750° C., the etching rate became as high as 289 m/h.

Figure 11:
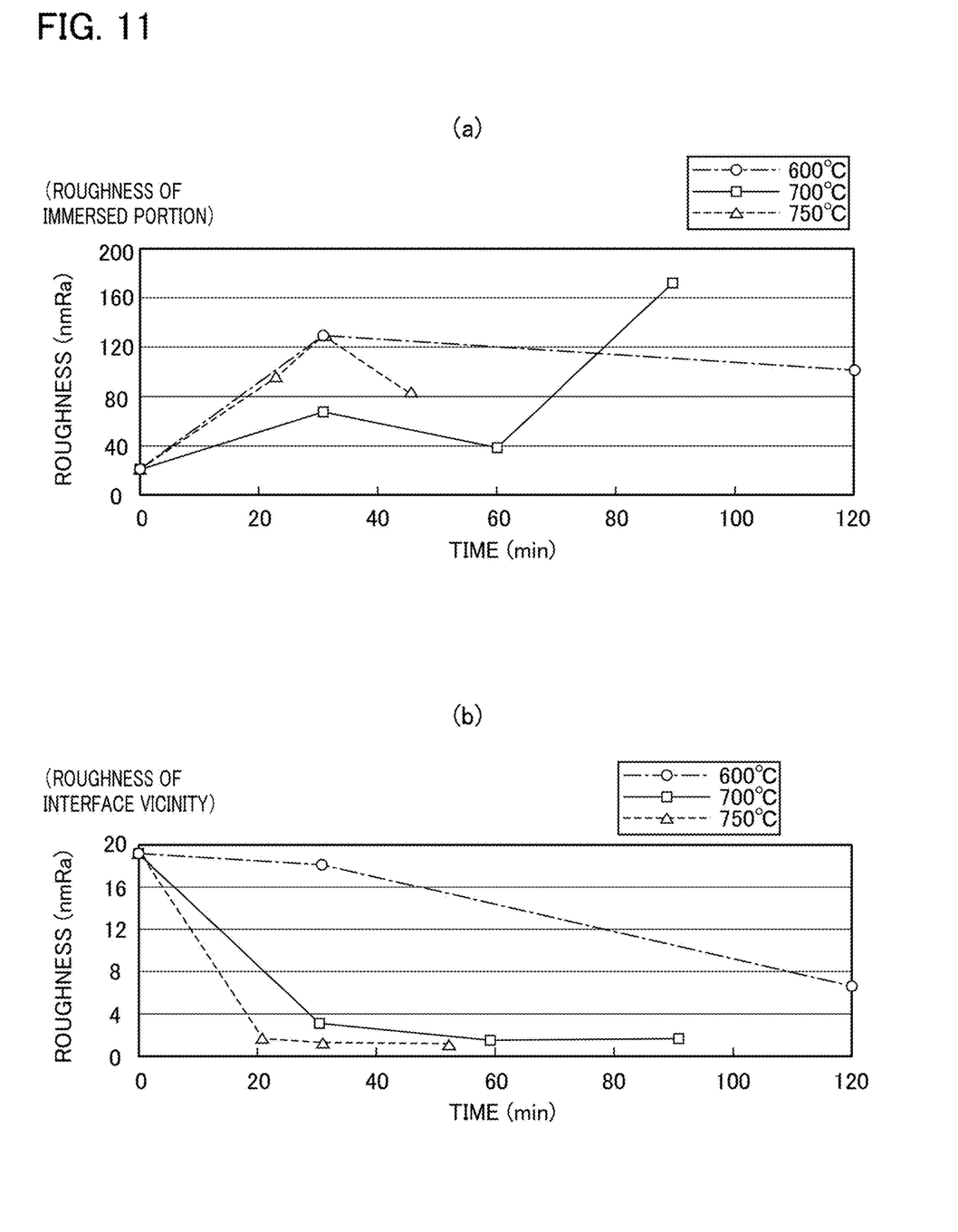
FIG. 11(a) illustrates a relationship between an etching time and roughness in an immersed portion.
FIG. 11(b) illustrates a relationship between an etching time and roughness in a vicinity of an interface of a non-immersed portion.

Moreover, FIG. 11(a) illustrates the roughness of the etching target surface on the immersed portion IM, and FIG. 11(b) illustrates the roughness of the etching target surface on the interface vicinity V of the non-immersed portion NIM. In the immersed portion, observed was a tendency in which the roughness was increased once and thereafter decreased. In consideration of the result of observing the etching target surface, this tendency was surmised to result from the fact that latent scratches caused by the diamond grinding appeared in an initial period of the etching, followed by gradual smoothing.

Moreover, the etching rate was low in the immersed portion IM, and 120 minutes in the experiment seem to be a time insufficient for reducing the roughness of the immersed portion IM. However, it seemed that it was difficult to apply this experiment condition to the mirror surface formation since the tendency in which the etch pits were increased was observed.

Meanwhile, in the non-immersed portion NIM, it was seen that the surface roughness thereof reached such a reached surface roughness of 1.4 nmRa when the temperature became 700° C. or more. Then, from the observation result of the etching target surface, no occurrence of the etch pits was observed under any condition. No occurrence of the etch pits was observed from the result of observing the etching target surface already subjected to the etching processing at 600° C. for 120 minutes, which were processing conditions where the etching rate was as low as 23 μm/h.

Influence Given by Atmosphere to Roughness and Etching Rate

On the basis of the experiment conditions of Experiment example 1, experiments were performed under a condition where an experiment time was set to 30 minutes in the case where a gas atmosphere was the atmosphere and in the case where the gas atmosphere was a nitrogen gas (a gas for inactivating the inside of the electric furnace by removing an oxygen gas), and influences in both cases were investigated.

Influence of Nitrogen Atmosphere

Figure 12:
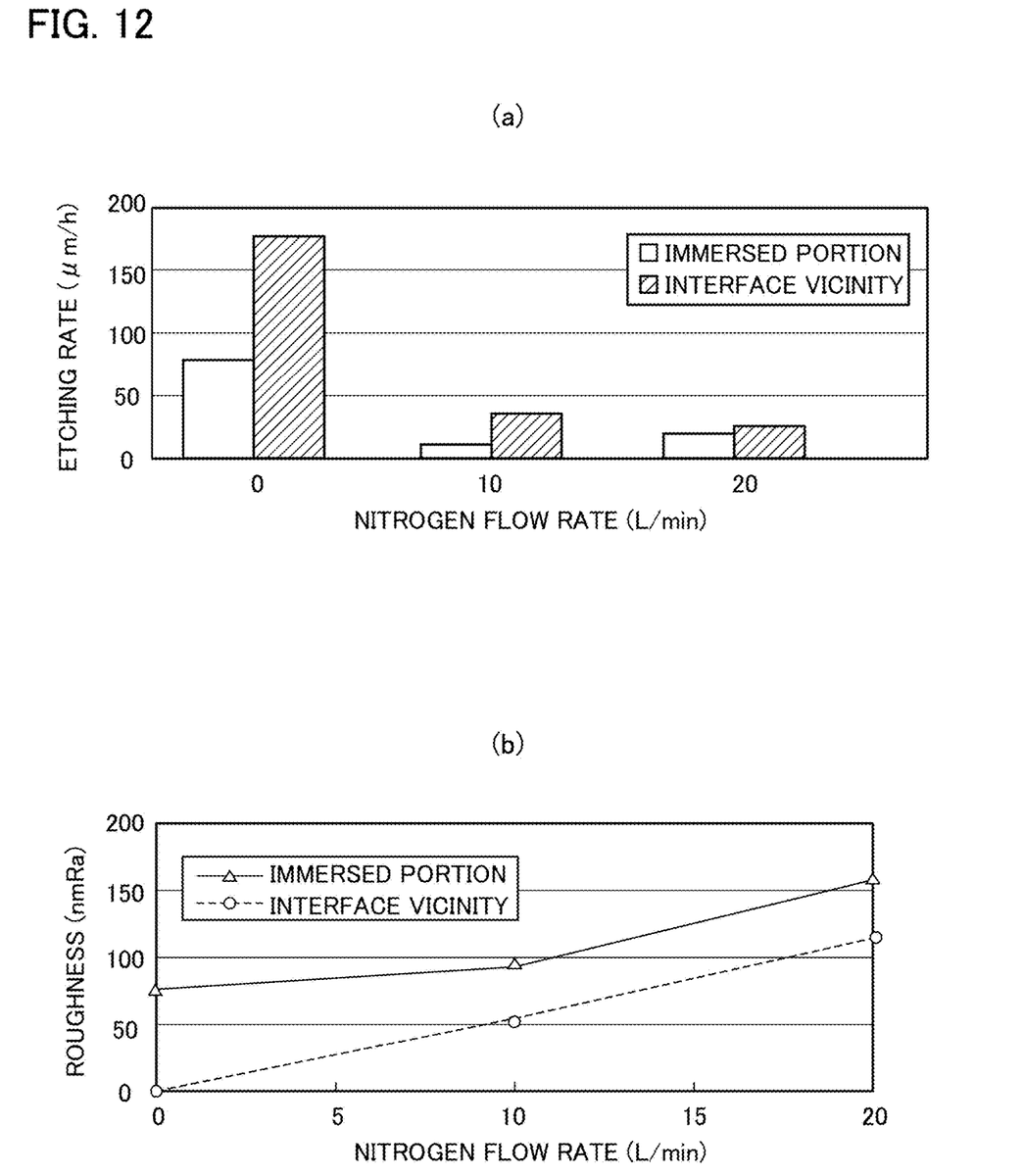
FIG. 12(a) illustrates a relationship between a nitrogen flow rate and an etching rate.
FIG. 12(b) illustrates a relationship between the nitrogen flow rate and the roughness.

The etching was performed while flowing nitrogen into the electric furnace. With regard to the immersed portion IM and the interface vicinity V of the non-immersed portion NIM, FIG. 12(a) illustrates relationships between a nitrogen flow rate and the etching rate, and FIG. 12(b) illustrates relationships between the nitrogen flow rate and the roughness. Note that, in FIG. 12(a), a nitrogen flow rate of 0 L/min means that the inside of the electric furnace is still filled with the atmosphere since nitrogen is not flown therethrough.

In each of the immersed portion IM and the interface vicinity V, the etching rate was greatly reduced at a nitrogen flow rate of 10 L/min, and at a flow rate more than the above, no more change was observed.

Meanwhile, the roughness tended to be increased as the nitrogen flow rate was increased in each of the immersed portion IM and the interface vicinity V. Hence, it was surmised that, at the time of etching, latent scratches caused by grinding were first exposed, and were thereafter lost, whereby a mirror surface was obtained. From the observation result of the etching target surface, latent scratches were observed in both of the immersed portion IM and the interface vicinity V, and it is conceived that a cause of the tendency to increase the roughness is a slowdown of the mirror surface formation process due to the reduction of the etching rate.

Influence of Atmosphere

Figure 13:
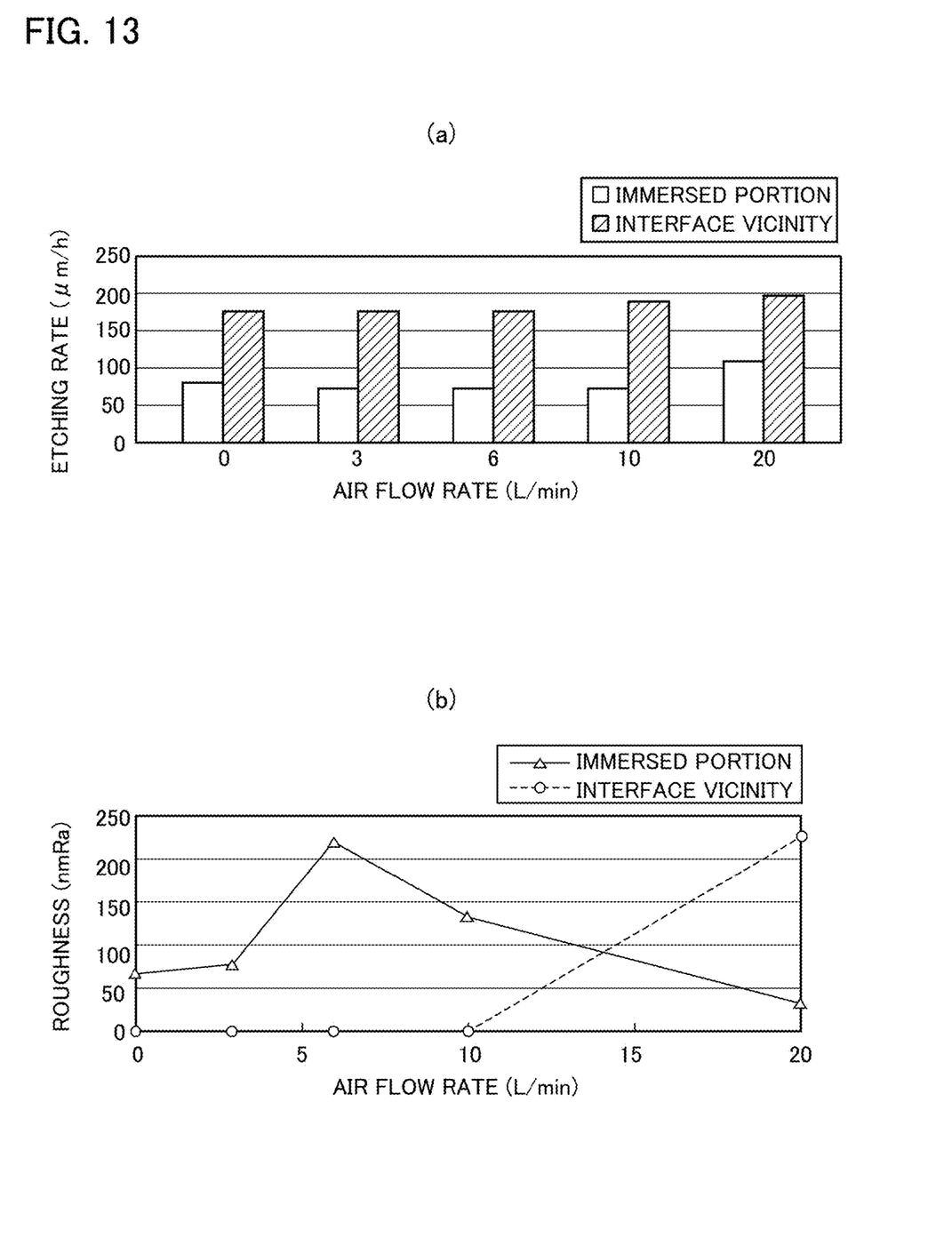
FIG. 13(a) illustrates a relationship between an air flow rate and the etching rate.
FIG. 13(b) illustrates a relationship between the air flow rate and the roughness.

Next, etching for investigating the influence of the atmosphere was performed. With regard to the immersed portion IM and the interface vicinity V of the non-immersed portion NIM, FIG. 13(a) illustrates relationships between an air flow rate and the etching rate, and FIG. 13(b) illustrates relationships between the air flow rate and the roughness. In each of the immersed portion IM and the interface vicinity V, the etching rate was hardly changed regardless of the air flow rate. However, it was seen that, in the immersed portion IM, the latent scratches (etch puts) were removed more as the air flow rate was increased even for the same etching time. Moreover, when the air flow rate was 20 L/min, film-shaped irregularities were formed on the interface vicinity V, and the roughness was significantly increased.

Note that such a result that a target etching state was obtained was achieved in the atmosphere and at an air flow rate up to 10 L/min. It may not be preferable that the air flow rate be more than 10 l/min since an oxide film was excessively generated. However, not only the air flow rate but also the relationship between the etching temperature and the liquid volume of the molten sodium hydroxide is adjusted, whereby the effect may be obtained even if the air flow rate is more than 10 L/min.

From the experiment results and the surmise, which are described above, it was seen that air acted on the etching. Hence, it is conceived that, in the non-immersed portion NIM, a thin film of the molten sodium hydroxide, which is formed of a vapor of sodium hydroxide or by surface tension, takes in oxygen of the atmosphere and promotes the oxidation at the time of reacting with SiC.

Experiment Example 3—Investigation of Removal Volumes by Etching on Si Surface and C Surface In this experiment example, in a SiC substrate in which one substrate surface was a Si surface and the other substrate surface was a C surface, etching amounts (removal volumes of SiC) were measured for both of the substrate surfaces, whereby etching rates thereof were compared with each other.

In this experiment example, a laser beam was condensed to positions at equal intervals in a substrate depth direction from the respective substrate surfaces, whereby machining marks were formed. Such formed positions were placed in the immersed portion IM, the interface vicinity V and the non-immersed portion NIM. Then, after etching by the molten sodium hydroxide, depth positions of the machining marks in the immersed portion IM, the interface vicinity V and the non-immersed portion NIM were measured by a microscope. Measurement results are shown in Table 1.

TABLE 1

|  | Immersed portion (IM) | Interface vicinity (V) | Non-immersed portion (NIM) |
|---|---|---|---|
| Removal volume on Si surface | 0.70 | 56.94 | 26.8 |
| Removal volume on C surface | 45.26 | 40.23 | 44.54 |
| Total | 45.96 | 97.17 | 71.40 |

As seen from Table 1, there was not a very large difference in removal volume on the C surface among the immersed portion IM, the interface vicinity V and the non-immersed portion NIM. Meanwhile, on the Si surface, the removal volume of SiC was largest at the interface vicinity V, SiC was hardly removed at the immersed portion IM as compared with that at the interface vicinity V, and the removal volume of SiC at the non-immersed portion NIM was approximately a half of that at the interface vicinity V. The measurement results were as described above.

Then, as other results, at the immersed portion IM and the non-immersed portion NIM, the removal volumes of SiC on the Si surface were smaller than the removal volumes of SiC at those portions on the C surface; however, at the interface vicinity V, the removal volume of SiC on the Si surface was larger than the removal volume of SiC on the C surface.

Summary of Experiment Examples 1 to 3

As described above, from Experiment examples 1 to 3, a highly efficient mirror surface forming phenomenon of the Si surface (substrate surface terminated by Si atoms) at the non-immersed portion by wet etching for the SiC substrate, the wet etching using molten NaOH, was found. From the experiments for investigating the basic characteristics of the etching, it was seen that the reached surface roughness became 1.4 nmRa by the etching at 750° C. for 20 minutes, and that the etching rate reached 304 μm/h as the maximum at 750° C. for 45 minutes. Moreover, it was seen that air acted in the etching atmosphere.

Although the embodiment and the experiment examples have been described above, these embodiment and experiment examples are illustrations for embodying the technical idea of this embodiment, and the scope of the embodiment is not intended to be limited thereto. These embodiments can be embodied in other various forms, and can be subjected to varieties of omissions, substitutions and alterations within the scope without departing from the spirit of the embodiment.

The present disclosure claims priority based on Japanese Patent Application No. 2017-027118 filed on Feb. 16, 2017, and the entire contents of this application are incorporated herein by reference.

LIST OF REFERENCE SYMBOLS

14 Laser condensing means
20 SiC crystal member
20r Irradiated surface
22 Modified layer
B Laser beam
F Interface position
PL SiC substrate
SHL Molten sodium hydroxide

The invention claimed is:

1. An etching method, under an environment of high temperature and containing oxygen and using molten sodium hydroxide as molten alkali brought into a prescribed high temperature range, comprising the steps of:
    forming an oxide film on etching target surfaces a silicon carbide (SiC) substrate, the surfaces of the SiC substrates including a Si surface and a C surface; and
    removing the Si surface of etching target surfaces at a higher rate than for surface while performing the step of forming the oxide film,
    wherein the oxide film is removed by flowing the molten sodium hydroxide to the etching target surface of the SiC substrate,
    and wherein, when the molten sodium hydroxide is flowed to the etching target surface, the SiC substrate is inclined at a prescribed angle with respect to a horizontal plane while setting from an upper portion side of the etching target surface to a lower portion side of the etching target surface.

2. The etching method according to claim 1, wherein the oxide film is removed by performing isotropic etching for the etching target surface.

3. The etching method according to claim 1, wherein an environment where the molten sodium hydroxide is used in the atmosphere is defined as the high-temperature environment containing oxygen.

4. The etching method according to claim 1, wherein an environment where the molten sodium hydroxide is used in a space where oxygen gas is supplied to the etching target surface is defined as the high-temperature environment containing oxygen.

5. The etching method according to claim 1, wherein the prescribed high temperature range is set to 650° C. or more.

6. The etching method according to claim 5, further comprising the steps of:
    disposing a laser condenser on an irradiated surface of a SiC crystal member in a non-contact manner, the laser condenser being for condensing a laser beam;
    applying a laser beam to the irradiated surface to condense the laser beam into an inside of the SiC crystal member by the laser condenser, and moving the laser condenser and the SiC crystal member relatively to each other to form a two-dimensional modified layer in the inside of the SiC crystal member;
    forming a SiC crystal substrate by peeling off, from the modified layer, a crystal layer formed by being divided by the modified layer, and
    obtaining the SiC crystal substrate by the peeling to use as the SiC substrate.

* * * * *

UNITED STATES PATENT AND TRADEMARK OFFICE
CERTIFICATE OF CORRECTION

| | | |
|---|---|---|
| PATENT NO. | : 10,923,354 B2 | Page 1 of 1 |
| APPLICATION NO. | : 16/485937 | |
| DATED | : February 16, 2021 | |
| INVENTOR(S) | : Junichi Ikeno, Yohei Yamada and Hideki Suzuki | |

It is certified that error appears in the above-identified patent and that said Letters Patent is hereby corrected as shown below:

On the Title Page

Please insert the First Assignee as --Shin-Etsu Polymer Co., Ltd., Tokyo (JP)--

Signed and Sealed this
Seventeenth Day of August, 2021

Drew Hirshfeld
*Performing the Functions and Duties of the*
*Under Secretary of Commerce for Intellectual Property and*
*Director of the United States Patent and Trademark Office*